United States Patent [19]
Maeda

[11] Patent Number: 6,020,559
[45] Date of Patent: Feb. 1, 2000

[54] FLAT FLEXIBLE CABLE

[75] Inventor: Osamu Maeda, Osaka, Japan

[73] Assignee: Funai Electric Co., Ltd., Japan

[21] Appl. No.: 08/982,525

[22] Filed: Dec. 2, 1997

[30] Foreign Application Priority Data

Dec. 2, 1996 [JP] Japan ................................. 8-012302

[51] Int. Cl.[7] .................................................. H01B 7/08
[52] U.S. Cl. ................................ 174/117 F; 174/117 FF
[58] Field of Search ........................ 174/117 F, 117 FF, 174/74 R

[56] References Cited

U.S. PATENT DOCUMENTS

| | | | |
|---|---|---|---|
| 3,226,473 | 12/1965 | Dahlgren | 174/117 FF |
| 3,469,016 | 9/1969 | Shelton | 174/117 FF X |
| 3,551,585 | 12/1970 | Smart et al. | 174/117 F X |
| 3,736,366 | 5/1973 | Wittenberg | 174/117 F X |
| 4,255,612 | 3/1981 | Grundfest | 174/117 FF X |
| 4,283,593 | 8/1981 | Piasecki et al. | 174/117 FF X |
| 4,991,665 | 2/1991 | Kueneman | 174/117 FF X |
| 5,483,021 | 1/1996 | Saen et al. | 174/117 FF X |
| 5,527,997 | 6/1996 | Saen et al. | 174/117 FF X |
| 5,804,767 | 9/1998 | Winfield et al. | 174/74 R |

FOREIGN PATENT DOCUMENTS 2-46966  4/1992  Japan .

*Primary Examiner*—Dean A. Reichard
*Attorney, Agent, or Firm*—Evenson McKeown, Edwards & Lenahan, P.L.L.C.

[57] ABSTRACT

A flat flexible cable made from a conductor array including a plurality of longitudinally extending flexible conductors arranged side-by-side in parallel and transversely spaced relationship. A first pair of heat resistant electrically insulating films lie above and below a first preselected longitudinal section of the conductor array. The first pair of films are adhered together with the preselected longitudinal section of the conductor array adhered therebetween. A second pair of electrically insulating flexible films lie above and below a second longitudinal section of the conductor array contiguous to the preselected longitudinal section. The second pair of films are adhered together with the second longitudinal section of the conductor array adhered therebetween. The pairs of films engage with a joint formed therebetween. At least one film of the first pair of films defines a plurality of access openings to conductors of the conductor array.

31 Claims, 5 Drawing Sheets

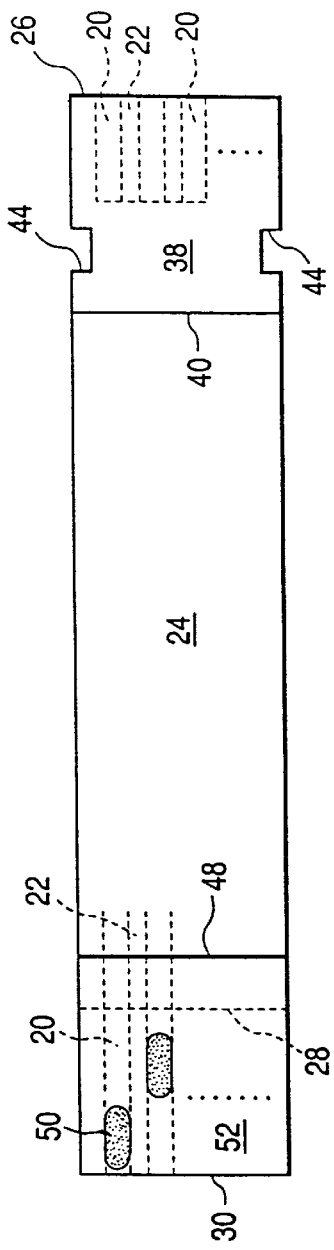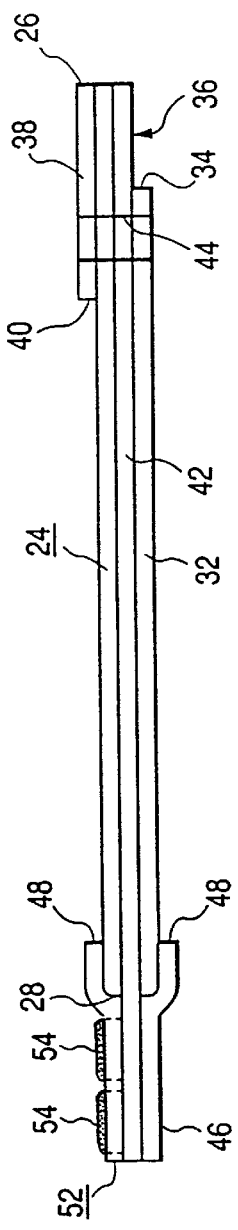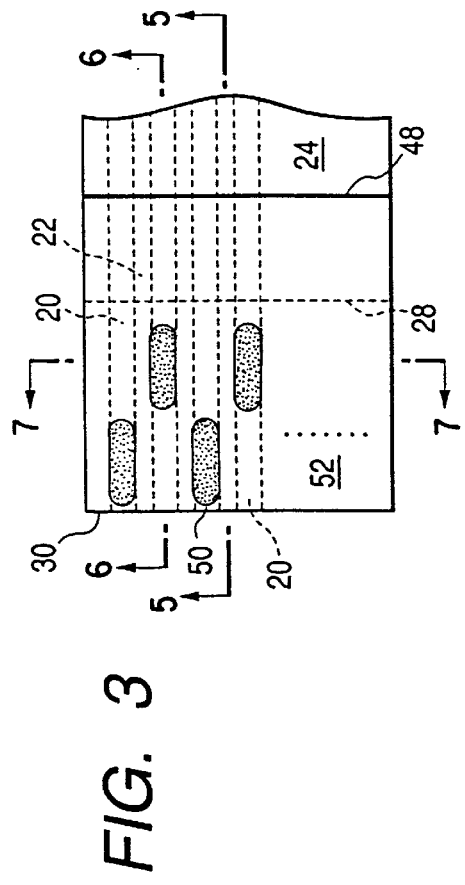

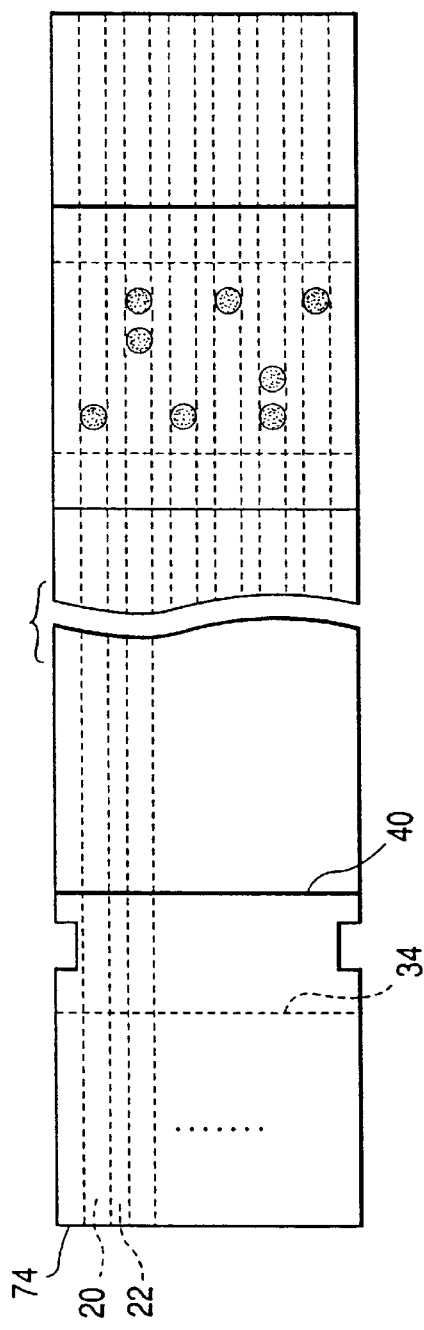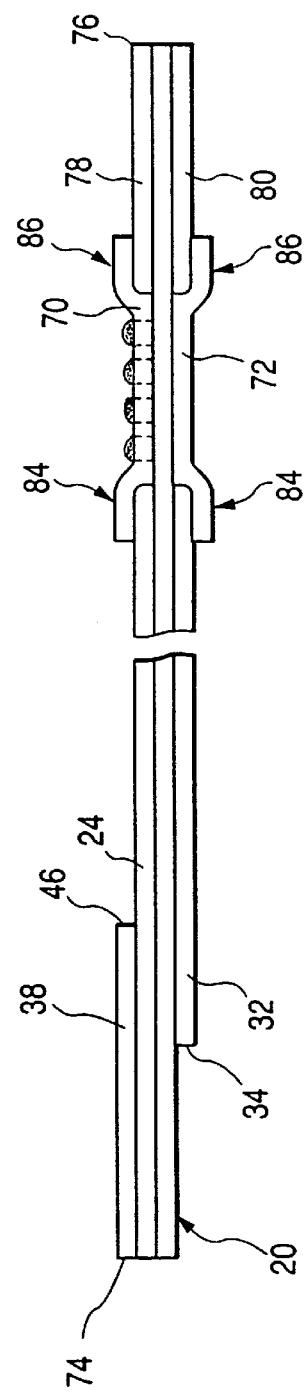

FLAT FLEXIBLE CABLE

BACKGROUND AND SUMMARY OF THE INVENTION

1. Field of the Invention

The present invention relates to a novel flat flexible cable.

2. Description of the Prior Art

A flat flexible cable is known e.g., for use as an outlet line from a rotary transformer stator to a head amplifier located on a printed circuit board. Such a cable may be made from an elongated flexible electrically insulating base film onto which is deposited an electrically conductive film. By known photolithographic techniques, the conductive film is etched to produce an electrically conductive pattern consisting of an array of longitudinally extending, transversely spaced conductive strips. Alternatively, the array can be produced by a printing technique. A flexible and electrically insulating cover film is adhered secured over the electrically conductive pattern. Also known is a flat flexible cable consisting of a plurality of longitudinally extending, transversely spaced metal conductors having a flexible and electrically insulating cover film on top of and another beneath the metal conductors which are adhered secured by heating and pressing to effectively encapsulate the metal conductors.

The latter mentioned flat flexible cable is less expensive to produce than the etched or painted flat flexible cable, but suffers from the drawback of not being usable in circumstances where it is necessary to solder connections to the conductors because the cover films are low temperature materials and the soldering process can cause adjacent conductors to short circuit. Therefore, this latter type of flat flexible cable is not used where solder connections need to be made.

SUMMARY OF THE INVENTION

Accordingly, the present invention has for its principal object the provision of a less expensive flat flexible cable, designed in a novel manner to enable positive connection of the cable conductors to respective leads or wires using soldering techniques.

The present invention accomplishes the foregoing object by providing a flat flexible cable comprising a conductor array including a plurality of longitudinally extending flexible conductors arranged side-by-side in parallel and transversely spaced relationship, a first pair of heat resistant electrically insulating films lying above and below a first preselected longitudinal section of the conductor array, said first pair of films being adhered together with the preselected longitudinal section of the conductor array adhered therebetween, a second pair of electrically insulating flexible films lying above and below a second longitudinal section of the conductor array contiguous to the preselected longitudinal section, said second pair of films being adhered together with the second longitudinal section of the conductor array adhered therebetween, said pairs of films engaging with a joint formed therebetween, and at least one film of the first pair of films defining a plurality of access openings to conductors of the conductor array.

More particularly, the novel flat flexible cable design comprises a conductor array consisting of a plurality of elongated metal conductors e.g., copper, arranged in a side-by-side parallel relationship, but transversely spaced, that are encapsulated between a pair of flexible, electrically insulating films e.g., low-cost, low-temperature, flame retardant polyester, that terminate short of (spaced from) one end of the conductors. The laminated construction is made by heating and pressing the films together with the conductors therebetween. A pair of special high temperature, heat resistant insulating films e.g., polyimide, securely encapsulate, using a known flame resistant adhering agent, the said one end of the conductors. The heat resistant films form overlapping or butt joints with the polyester electrically insulating films, to insure complete coverage of the conductors. At least one of the heat resistant polyimide films defines a plurality of openings registering with, providing access to and exposing the metal conductors with the openings registering with adjacent conductors being longitudinally offset or shifted. The conductors can be left exposed or the openings can receive a known solder flux coating for the conductors or a known preliminary tin-lead (SnPb) soldering of the conductors that is extra solder already present on the conductors to shorten the time of making connections to a printed circuit board.

The electrically insulating films can be a suitable inexpensive polyester material having a low melting temperature whereas the heat resistant insulating films have a relatively high melting point to be unaffected by conventional soldering temperatures. Polyimides particularly, are suitable for the heat resistant insulating films and give the additional advantage of being stiffer than the electrically insulating polyester films. A principal advantage of the present invention is the use of limited amounts of polyimide, an expensive material, and use of a major amount of low cost polyester.

Other and further objects and advantages of the present invention will become more readily apparent from the following detailed description of preferred embodiments of the invention when taken in conjunction with the appended drawings.

BRIEF DESCRIPTION OF THE DRAWINGS

FIG. 1 is a top plan view of one preferred embodiment of the present invention;

FIG. 2 is a side elevation of the embodiment shown in FIG. 1;

Figure 4:
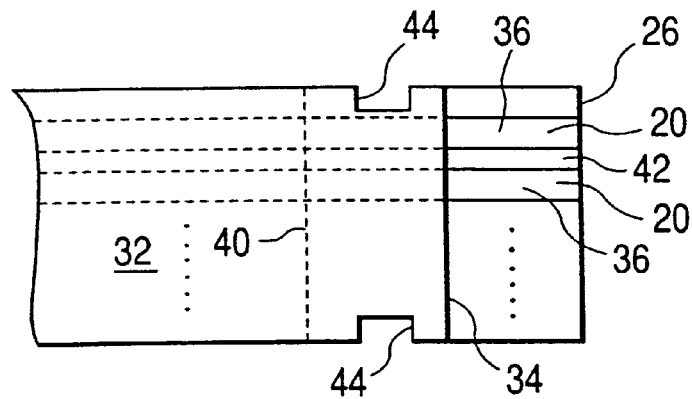
Figure 5:
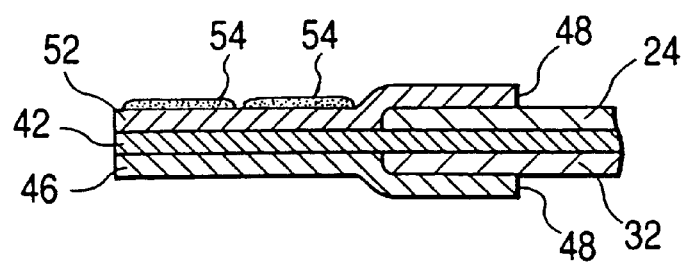
Figure 6:
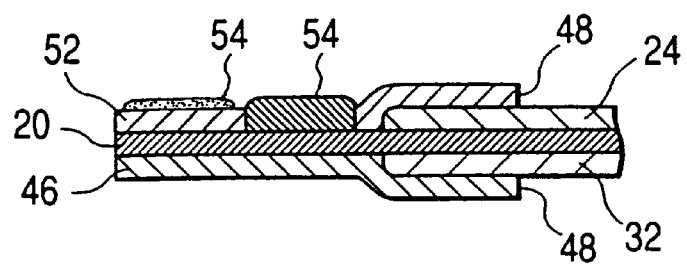
Figure 7:
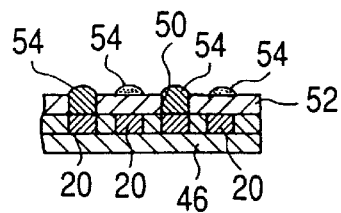
Figure 8:
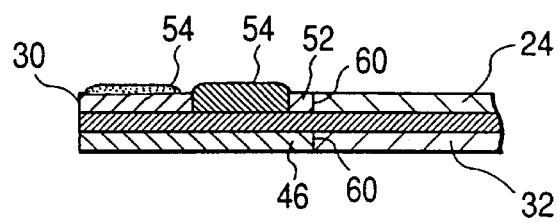
Figure 9:
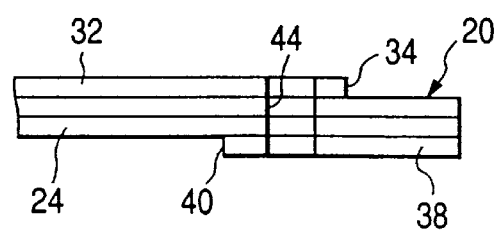
Figure 10:
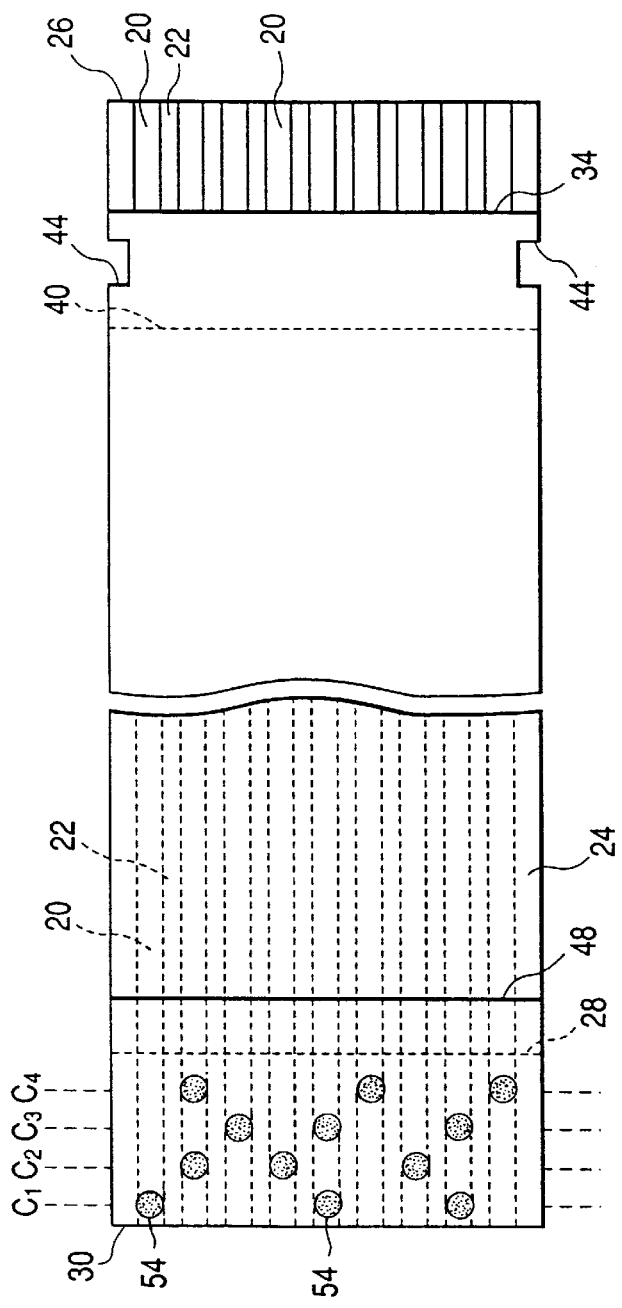
Figure 11:
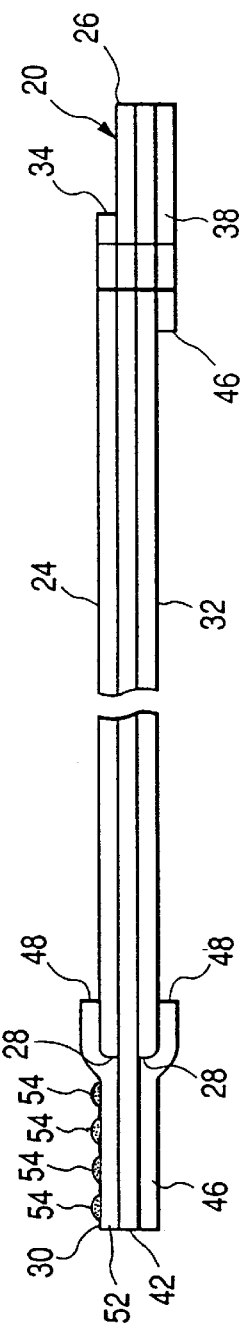

FIG., 3 is an enlarged top plan view of one end of the embodiment of FIG. 1;

FIG. 4 is a enlarged bottom plan view of the other end of the embodiment of FIG. 1;

FIG. 5 is a section taken along line A—A of FIG. 3;

FIG. 6 is a section taken along line B—B of FIG. 3;

FIG. 7 is a section taken along line C—C of FIG. 3,

FIG. 8 is an end view of the one end shown in FIG. 3, showing a butt joint;

FIG. 9 is an inverted side elevation view of the other end shown in FIG. 4:

FIG. 10 is a top plan view of a second preferred embodiment;

FIG. 11 is a side elevation view of the embodiment shown in FIG. 10;

FIG. 12 is a top plan view of a third preferred embodiment; and

FIG. 13 is a side elevation view of the embodiment shown in FIG. 12.

Figure 14:
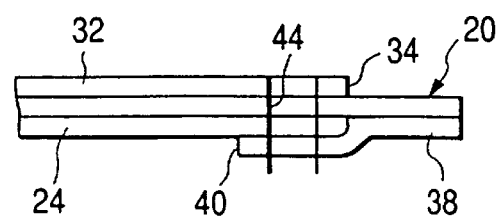

FIG. 14 is a view like FIG. 9 showing a modification.

DETAILED DESCRIPTION OF THE PREFERRED EMBODIMENTS

Referring to the drawings, FIGS. 1–7 and 9 show a preferred embodiment of the invention. The novel flat flexible cable consists of an array of a plurality of elongated flexible metal conductors 20 arranged co-planar, in parallel, separated transversely by gaps 22. The conductors 20 are covered on top by an elongated flexible low-melting polyester film 24 that extends from end 26, at the right in the drawing, terminating at point 28, spaced from end 30, at the left in the drawing. A second elongated flexible low-melting polyester film 32 covers the conductors 20 on the bottom and extends from point 28 toward end 26 but terminates at 34 spaced from end 26. Films 24 and 32 are composed of known low cost, low temperature, flame retardant polyester material. The portion 36 of conductors 20 left exposed by the film 32 faces downward, and serves as a contactor array for insertion into a known connector, such as is found on a PC board. A short length of staff polyester film 38 extends from end 26, on top of film 24 and terminates at point 40. All of the mentioned films, as well as the conductors, are joined together in the manner described by heating and pressing as known. Reference numeral 42 is applied to the material which fills the gaps 22. Notches 44 are cut into the sides of the cable between points 34 and 40. The metal conductors 20 consist of copper ribbons which may be coated for their entire length with a suitable SnPb solder.

Applied to the end 30 of the cable using a known flame resistant adhering agent are top and bottom heat resistant, polyimide films 52 and 46 which extend from end 30 to a point 48 so that the films 52 and 46 overlap the films 24 and 32, respectively, to form overlapping joints (without any gaps or exposure of conductors 20). Films 52 and 46 are adhesively joined to the conductors 20 and films 24 and 32 by the adhering agent. Film 52 is provided with a plurality of through holes or bores 50, each one aligned or registered with one of the conductors 20 with adjacent holes 50 being longitudinally offset or shifted so that no two adjacent holes so are transversely overlapped or aligned.

In the embodiment of FIGS. 1–7 and 9, the film and conductors 20 are 0.1 mm thick, the conductors 20 are elliptical 1 mm wide and the gaps 22 are 0.25 mm wide. The holes 50 are 1 mm wide by 2 mm long. The exposure of the conductors 20 at end 26, i.e., point 34, is about 4 mm, The point 28 is about 9 mm from end 30. Point 40 is about 10 mm from end 26. The overall length of the cable is about 65 mm, but this is dependent on the spacing between the connection points. As shown, the access holes 50 are only present at end 30 and only present on one side. It is possible to provide holes 50 in the bottom film 46 as well, it desired. Also, end 26 is finished to be inserted into a known connector and held therein by spring clips engaging in notches 44. The ends 26 and 30 may be completed the same, like end 30 or like end 26.

The access holes 50 may be left vacant with portions of the conductors 20 exposed. Also, it is possible to finish holes 50 by applying a known solder flux coating to the exposed conductors 20 or, as shown in the drawing, to fill holes 50 over the flux coating with a preliminary known SnPb solder 54 which will facilitate and shorten the time for the making of subsequent soldered connections. The amount of solder put into a hole 50 is sufficient to make a connection to a PCB. Also, the number of conductors 20 in a cable may vary from about 3 up to about 30. If 4 conductors 20 are used, the cable is about 6.25 mm wide.

As shown in FIG. 8, the joint between the polyimide films 52 and 46 and the polyester films 24 and 32, respectively, can be a butt joint 60 rather than the overlap joint shown in FIGS. 1–7 and 9. The important point is that the metal conductors 20 under the joint must be fully covered without any gaps in the joint 60 that would expose the metal conductors 20.

Referring to FIG. 14, the end 26 can be modified to eliminate a portion of film 24 and have the film 36 directly underlie conductors 20. An overlap joint is formed between film 38 and film 24.

Referring now to FIGS. 10 and 11, an embodiment is shown in which at and 30, round holes 54 are formed in the film 52 and are arranged in a spatial pattern with no two adjacent or successive holes being aligned transversely. In some cases, two holes appear for selected conductors, but the two holes are spaced apart longitudinally a distance equal to the diameter of a hole plus the requisite clearance to avoid transverse alignment or overlap. In the hole array depicted, four columns $C_1$–$C_4$ of holes are provided to obtain the requisite spacing both transversely and longitudinally. The end 26 is finished as in the previous embodiment except that the exposed conductors are facing up like the solder filled holes at end 30.

In the embodiment shown in FIGS. 12 and 13, polyimide films 70 and 72 are inserted in the cable intermediate its ends. The left end 74 of the cable, as viewed in the FIGS. 12 and 13 is completed like end 26 in the FIG. 1 embodiment with the exposed conductors 20 facing down. The conductors 20 pass through the films 70 and 72 and continue to end 76. Additional polyester films 78 and 80 cover the conductors 20 between the films 70 and 72 and end 76. In this embodiment, the films 70 and 72 form lap joints 84 with films 24 and 32 and additional lap joints 86 with films 78 and 80. The holes 50, filled with solder 54, and formed in film 70, face up, and are staggered or offset longitudinally as previously described. Also, for certain conductors 20, the holes 50 are arranged in pairs slightly spaced longitudinally for clearance.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A flat flexible cable comprising:
   a conductor array including a plurality of longitudinally extending flexible conductors arranged side-by-side in parallel and transversely spaced relationship;
   a first pair of heat resistant electrically insulating films laying above and below a first longitudinal section of the conductor array, said first pair of films being adhered together, with the first longitudinal section of the conductor array adhered therebetween; and
   a second pair of electrically insulating flexible films lying above and below a second longitudinal section of the conductor array contiguous to the first longitudinal section, said second pair of films being adhered together, with the second longitudinal section of the conductor array adhered therebetween; wherein
   said pairs of films engage with a joint formed therebetween;
   at least one film of the first pair of films has a plurality of access openings to conductors of the conductor array;
   the plurality of access openings are arranged such that transversely adjacent openings are longitudinally offset; and
   at least one of said access openings contains a solder flux applied to a respective conductor accessed through said at least one of said access openings.

2. A flat flexible cable according to claim 1, wherein the first longitudinal section is an end section of the conductor array.

3. A flat flexible cable according to claim 1, wherein the first longitudinal section is an intermediate section of the conductor array.

4. A flat flexible cable according to claim 1, wherein the first pair of films are composed of polyimide.

5. A flat flexible cable according to claim 1, wherein the second pair of films are composed of polyester.

6. A flat flexible cable according to claim 1, wherein the joint is an overlapping point with the first pair of films overlapping the second pair of films.

7. A flat flexible cable according to claim 1, wherein the joint is a butt joint in which the first and second pairs of electrically insulating films abut each other in a longitudinal direction of the cable.

8. A flat flexible cable according to claim 1, wherein the plurality of access openings are longitudinally staggered.

9. A flat flexible cable according to claim 1, wherein at least two of the access openings provide access to the same one of said conductors.

10. A flat flexible cable according to claim 1, wherein the access openings are elliptical in shape with the major axis extending longitudinally.

11. A flat flexible cable according to claim 1, wherein the second pair of films are heat resistant.

12. A flat flexible cable according to claim 1, wherein both films of the first pair are provided with access openings.

13. A flat flexible cable comprising:
  a conductor array including a plurality of longitudinally extending flexible conductors arranged side-by-side in parallel and transversely spaced relationship;
  a heat resistant first pair of electrically insulating films laying above and below a first longitudinal section of the conductor array, said first pair of films being adhered together, with the first longitudinal section of the conductor array adhered therebetween; and
  a second pair of electrically insulating flexible films lying above and below a second longitudinal section of the conductor array contiguous to the first longitudinal section, said second pair of films being adhered together, with the second longitudinal section of the conductor array adhered therebetween; wherein
    said pairs of films engage with a joint formed therebetween; and
    at least one film of the first pair of films has a plurality of access openings to conductors of the conductor array; and
    said first pair of electrically insulating films has a melting point which is substantially greater than a melting point of said second pair of electrically insulating films.

14. A flat flexible cable according to claim 12, wherein said second pair of electrically insulating films has a flexibility which is greater than a flexibility of said first pair of electrically insulating films.

15. A flat flexible cable according to claim 12, wherein said first pair of electrically insulating films is made of a solderable material.

16. A flat flexible cable comprising:
  a conductor array including a plurality of longitudinally extending flexible conductors arranged side-by-side in parallel and transversely spaced relationship;
  a heat resistant first pair of electrically insulating films laying above and below a first longitudinal section of the conductor array, said first pair of films being adhered together, with the first longitudinal section of the conductor array adhered therebetween; and
  a second pair of electrically insulating flexible films lying above and below a second longitudinal section of the conductor array contiguous to the first longitudinal section, said second pair of films being adhered together, with the second longitudinal section of the conductor array adhered therebetween; wherein
    said pairs of films engage with a joint formed therebetween; and
    at least one film of the first pair of films has a plurality of access openings to conductors of the conductor array; and
    the second pair of films extend to one end of the conductor array with one of the films terminated spaced from said one end to leave conductors exposed, and further a stiff plastic film adhered to an opposite side of the cable to provide rigidity to the said one end.

17. A flat flexible cable according to claim 16, wherein notches are defined in longitudinal edges of the cable in proximity to said one end.

18. A flat flexible cable according to claim 16, wherein the exposed conductors face oppositely to the access openings.

19. A flat flexible cable according to claim 16, wherein the exposed conductors face in the same direction as the access openings.

20. A flat flexible cable comprising:
  a conductor array including a plurality of longitudinally extending flexible conductors arranged side-by-side in parallel and transversely spaced relationship;
  a first pair of heat resistant electrically insulating films laying above and below a first longitudinal section of the conductor array, said first pair of films being adhered together, with the first longitudinal section of the conductor array adhered therebetween; and
  a second pair of electrically insulating flexible films lying above and below a second longitudinal section of the conductor array contiguous to the first longitudinal section, said second pair of films being adhered together, with the second longitudinal section of the conductor array adhered therebetween; wherein
    said pairs of films engage with a joint formed therebetween;
    at least one film of the first pair of films has a plurality of access openings to conductors of the conductor array;
    the plurality of access openings are arranged such that transversely adjacent openings are longitudinally offset; and
    at least one of said access openings contains solder on a respective one of the conductors which is accessible through said access openings, said solder being physically separated from adjacent ones of said access openings.

21. A flat flexible cable according to claim 20, wherein the first longitudinal section is an end section of the conductor array.

22. A flat flexible cable according to claim 20, wherein the first longitudinal section is an intermediate section of the conductor array.

23. A flat flexible cable according to claim 20, wherein the first pair of films are composed of polyimide.

24. A flat flexible cable according to claim 20, wherein second pair of films are composes of polyester.

25. A flat flexible cable according to claim 20, wherein the joint is an overlapping joint with the first pair of films overlapping the second pair of films.

26. A flat flexible cable according to claim 20, wherein the joint is a butt joint in which the first and second pairs of electrically insulating films abut each other in a longitudinal direction of the cable.

27. A flat flexible cable according to claim 20, wherein the plurality of access openings are longitudinally staggered.

28. A flat flexible cable according to claim 20, wherein at least two of the access openings provide access to the same one of said conductors.

29. A flat flexible cable according to claim 20, wherein the access openings are elliptical in shape with the major axis extending longitudinally.

30. A flat flexible cable according to claim 20, wherein the second pair of films are heat resistant.

31. A flat flexible cable according to claim 20, wherein both films of the first pair are provided with access openings.

* * * * *